US006925000B2

(12) United States Patent
Sussner

(10) Patent No.: US 6,925,000 B2
(45) Date of Patent: Aug. 2, 2005

(54) METHOD AND APPARATUS FOR A HIGH DENSITY MAGNETIC RANDOM ACCESS MEMORY (MRAM) WITH STACKABLE ARCHITECTURE

(75) Inventor: Heinrich Sussner, Saratoga, CA (US)

(73) Assignee: Maglabs, Inc., San Jose, CA (US)

( * ) Notice: Subject to any disclaimer, the term of this patent is extended or adjusted under 35 U.S.C. 154(b) by 9 days.

(21) Appl. No.: 10/735,436

(22) Filed: Dec. 12, 2003

(65) Prior Publication Data

US 2005/0128794 A1    Jun. 16, 2005

(51) Int. Cl.$^7$ ............................................. G11C 11/00
(52) U.S. Cl. ...................................... 365/158; 365/173
(58) Field of Search ................................ 365/158, 173, 365/189.04, 213, 232

(56) References Cited

U.S. PATENT DOCUMENTS

| | | | |
|---|---|---|---|
| 5,640,343 A | 6/1997 | Gallagher et al. ........... 365/171 |
| 5,703,805 A | 12/1997 | Tehrani et al. .............. 365/173 |
| 5,838,608 A | 11/1998 | Zhu et al. .................... 365/158 |
| 5,930,164 A | 7/1999 | Zhu ........................... 365/158 |
| 6,072,718 A | 6/2000 | Abraham et al. ........... 365/173 |
| 6,169,689 B1 | 1/2001 | Naji |
| 6,269,018 B1 | 7/2001 | Monsma et al. |
| 6,272,041 B1 | 8/2001 | Naji ........................... 365/171 |
| 6,331,943 B1 | 12/2001 | Naji et al. ................... 365/158 |
| 6,385,082 B1 | 5/2002 | Abraham et al. |
| 6,483,734 B1 * | 11/2002 | Sharma et al. ................ 365/97 |
| 6,515,888 B2 | 2/2003 | Johnson et al. |
| 6,522,573 B2 * | 2/2003 | Saito et al. .................. 365/158 |
| 6,535,416 B1 | 3/2003 | Daughton et al. |
| 6,590,806 B1 | 7/2003 | Bhattacharyya ............. 365/173 |
| 6,594,175 B2 | 7/2003 | Torok et al. ................. 365/171 |
| 6,603,678 B2 | 8/2003 | Nickel et al. |
| 6,621,730 B1 | 9/2003 | Lage .......................... 365/158 |
| 6,631,085 B2 | 10/2003 | Kleveland et al. |
| 6,704,220 B2 | 3/2004 | Lauschner |
| 2002/0009840 A1 | 1/2002 | Torok et al. ................. 438/171 |
| 2002/0036331 A1 | 3/2002 | Nickel et al. ............... 257/421 |
| 2002/0163834 A1 | 11/2002 | Scheuerlein et al. |
| 2003/0090930 A1 | 5/2003 | Rizzo .......................... 365/158 |
| 2003/0156444 A1 | 8/2003 | Lee et al. ..................... 365/66 |

(Continued)

FOREIGN PATENT DOCUMENTS

JP          2003-133528 A2    5/2003    ......... H01L 27/105

OTHER PUBLICATIONS

Reohr et al., "Memories of Tomorrow", IEEE Circuits & Devices Magazine, Sep. 2002, pp. 17-27.

(Continued)

Primary Examiner—Thong Q. Le

(57) ABSTRACT

The invention comprises a magnetic random access memory (MRAM) with stackable architecture. A first word line is configured to carry electric current. A first memory column is electrically coupled to the word line and is comprised of a plurality of memory cells electrically coupled and adjacent to each other. Each memory cell is configured to store data by magnetic alignment of the memory cell. A first bit line column is electrically isolated from the first word line and is magnetically coupled to and electrically isolated from the first memory column. The first bit line column comprises a plurality of bit lines that are electrically isolated from each other and configured to carry electric current during a memory read and a memory write. The first bit line column is parallel to the first memory column.

33 Claims, 7 Drawing Sheets

U.S. PATENT DOCUMENTS

2003/0161180 A1    8/2003    Bloomquist et al. ........ 365/173
2003/0170976 A1    9/2003    Molla et al. ................ 438/637
2003/0214835 A1    11/2003   Nejad et al.

OTHER PUBLICATIONS

Desikan et al.., "On-chip MRAM as a High-Bandwidth, Low-Latency Replacement for DRAM Physical Memories", Department of Computer Sciences Tech Report TR-02-47, The University of Texas at Austin, Sep. 27, 2002.

Katti, "Current-in-plane pseudo-spin-valve device performance for giant magnetoresistive random access memory applications (invited)", Journal of Applied Physics, vol. 91, No. 10, May 15, 2002, PP. 7245-7250.

Katine et al., "Current-induced realignment of magnetic domains in nanostructured Cu/Co multilayer pillars", Appl. Phys. Lett., vol. 76, No. 3, Jan. 17, 2000, PP. 354-356.

* cited by examiner

METHOD AND APPARATUS FOR A HIGH DENSITY MAGNETIC RANDOM ACCESS MEMORY (MRAM) WITH STACKABLE ARCHITECTURE

BACKGROUND OF THE INVENTION

1. Field of the Invention

The invention relates generally to magnetic random access memory (MRAM). Specifically, the invention relates to a high-density memory architecture comprising a vertical stack of magnetic storage elements.

2. Description of the Related Art Including Information Disclosed Under 37 CFR 1.97 and 1.98

MRAM devices typically consist of a planar arrangement of memory cells with two magnetic layers separated by a tunnel junction. One of the magnetic layers is a fixed reference layer while the other layer is a storage layer having a magnetic polarization that is altered for storage. The storage layer can be oriented along one of two directions along a magnetic uni-axial anisotropy axis approximately parallel or anti-parallel to the magnetization of the reference layer.

A memory write to a memory cell aligns the storage layer in either the parallel or the anti-parallel position with respect to the reference layer. A memory read determines the resistance of the memory cell being read and determines the alignment of the storage layer based on the resistance of the memory cell. Then the "value" of the memory cell is known.

One problem with the prior art is that it is difficult to manufacture MRAM cells and they require a significant amount of space, therefore yielding a low MRAM density. Furthermore, memory write requires a narrow distribution of switching fields in order to avoid writing of half selected bits or writing adjacent bits due to crosstalk. Memory read is usually performed by comparing the resistance of the cell being read to a reference cell, again requiring a relatively tight tolerances of cell resistance values across the memory chip. MRAM are therefore difficult to manufacture and have low density.

What is needed is high-density MRAM that is easy to manufacture and provides good selectivity of memory cells. The invention should reduce the area required by memory, be easily manufactured by lowering the margin requirements for memory resistance, provide improved selectivity of memory cells, and be scalable.

SUMMARY OF THE INVENTION

The invention comprises a magnetic random access memory (MRAM) with stackable architecture. A first word line is configured to carry electrical current. A first memory column is electrically coupled to the word line and is comprised of a plurality of memory cells electrically coupled and adjacent to each other. Each memory cell is configured to store data by magnetic alignment of the memory cell. A first bit line column is electrically isolated from the first word line and is magnetically coupled to and electrically isolated from the first memory column. The first bit line column comprises a plurality of bit lines that are electrically isolated from each other and configured to carry electrical current during a memory read and a memory write. The first bit line column is parallel to the first memory column.

The advantages of the invention include a reduced MRAM area achieved by reducing the number of word lines, reducing the number of switches (for example, transistors and diodes) per memory cell and improving the geometry of the bit line/memory cell relationship, improved simplicity in the manufacturing process, improved selectivity, and increased memory density. For example, the invention may apply an eight-layer design with a cell size of only 1 F2.

BRIEF DESCRIPTION OF THE DRAWING(S)

DETAILED DESCRIPTION OF THE INVENTION

The layering processes and materials used in the following magnetic memory cells are well known in the material processing art. Although specific embodiments have been described, one of ordinary skill in the art will recognize that other materials and other layering processes than those described may be used in accordance with the invention.

Figure 1:
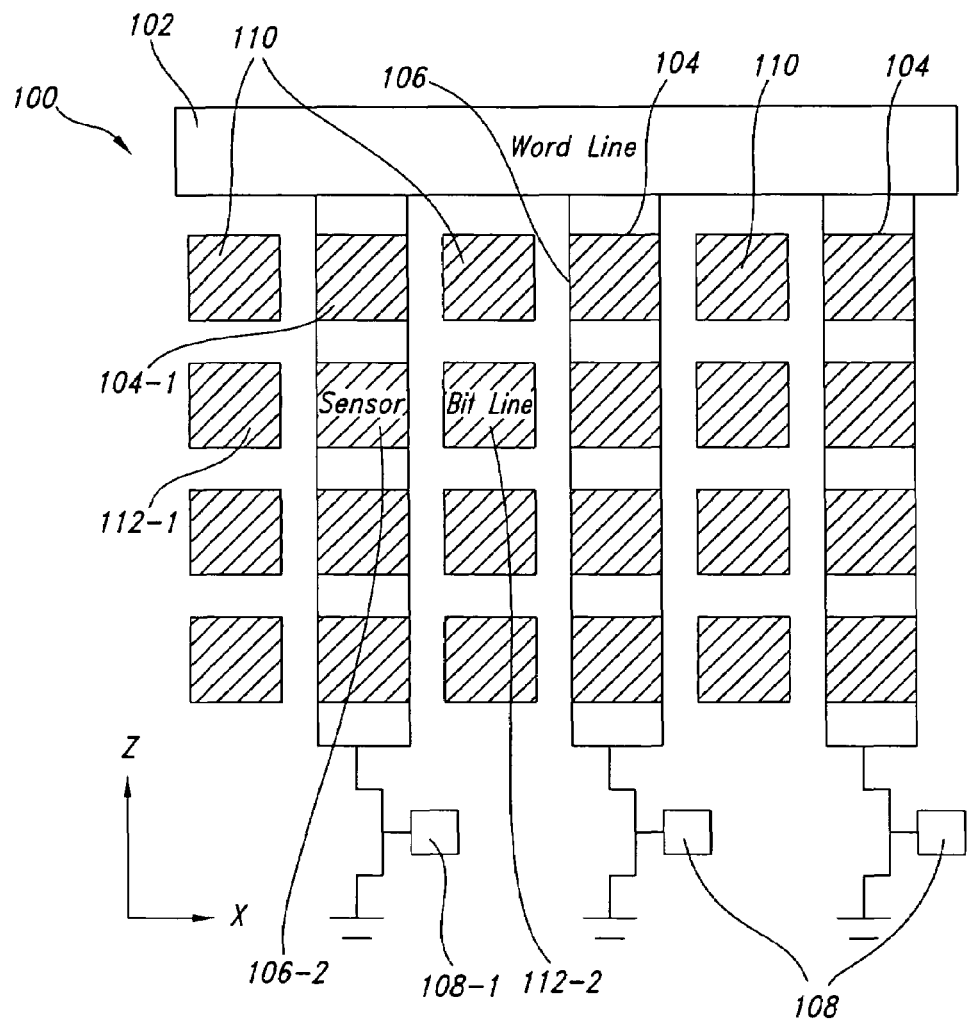
FIG. 1 is a schematic illustrating a cross section of one embodiment of the invention.

FIG. 1 is a schematic illustrating a cross section of one embodiment of MRAM 100. MRAM 100 includes electrically conducting word line 102 connected to memory columns 104. Each memory column 104 consists of one or more memory cells 106 stacked on top of each other and electrically connected.

Memory cell 106 is a magnetic tunnel junction (MTJ) composed of two layers: a storage layer and a readout layer. Both layers are magnetic with either in-plane magnetization or out-of-plane magnetization. The storage layer has a higher coercivity than the readout layer. Layers with in-plane magnetization may be made with, for example, approximately $Ni_{80}Fe_{20}$, Co, or CoFe alloys. Layers made with out-of-plane magnetization may be made with, for example, Co/Pt multilayers or Rare-Earth Transition Metal alloys. Although four memory cells 106 are illustrated in each memory column 104, fewer or more memory cells may be included.

Switch 108 is opposite word line 102 on memory column 104. Switch 108 turns on one or more of memory columns 104 during an operation. Word line 102 carries electrical current that flows through, for example, memory column 104-1 when switch 108-1 is activated. One aspect of the invention is that only one switch 108 is needed for multiple memory cells 106. In one embodiment, switches 108 are transistors. In the prior art, each memory cell typically has one transistor per memory cell.

Bit line columns 110 are positioned alongside memory columns 104. Although FIG. 1 illustrates a bit line column between each memory column, one skilled in the art will recognize that fewer bit line columns may be used in the invention. Bit line columns include bit lines 112. Bit lines 112 are conductors that carry electric current in order to generate a magnetic field that switches the polarity of the storage and readout layers in memory cells 106. Positioning bit lines 112 on the sides of memory cells 106 reduces masking layers and process steps during memory fabrication. The invention is applicable to both 1T1MTJ and 1D1MTJ architecture to achieve 1TnMTJ and 1DnMTJ respectively.

In one embodiment, MRAM 100 is fabricated on a substrate which contains transistors 108 for addressing memory columns 104 and peripheral circuitry providing power, sensing, address registers, etc. (not shown). A silicon wafer may be used as a substrate, however, other materials with appropriate electrical and thermal properties may also be used as a substrate. The substrate must be such that the address transistor 108 and all the peripheral electronics can be built in it. It should have sufficient thermal conductivity to dissipate the heat produced by the MRAM cells. Other materials include SiO, SiC, polySi.

Figure 2:
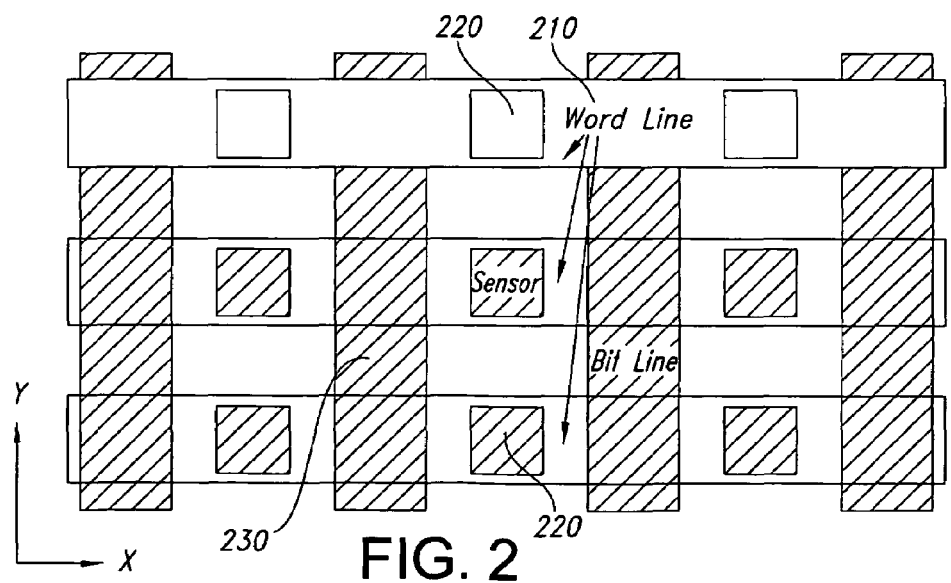
FIG. 2 is a schematic illustrating a plan view of one embodiment of the invention from FIG. 1.

FIG. 2 is a schematic illustrating a plan view of one embodiment of the invention from FIG. 1. MRAM 200 has word lines 210 connected to memory columns 220. Bit lines 230 are perpendicular to word lines 210 and stacked as illustrated in FIG. 1. Each word line 210 activates several memory columns 220, according to the design and architecture of MRAM 200.

Figure 3:
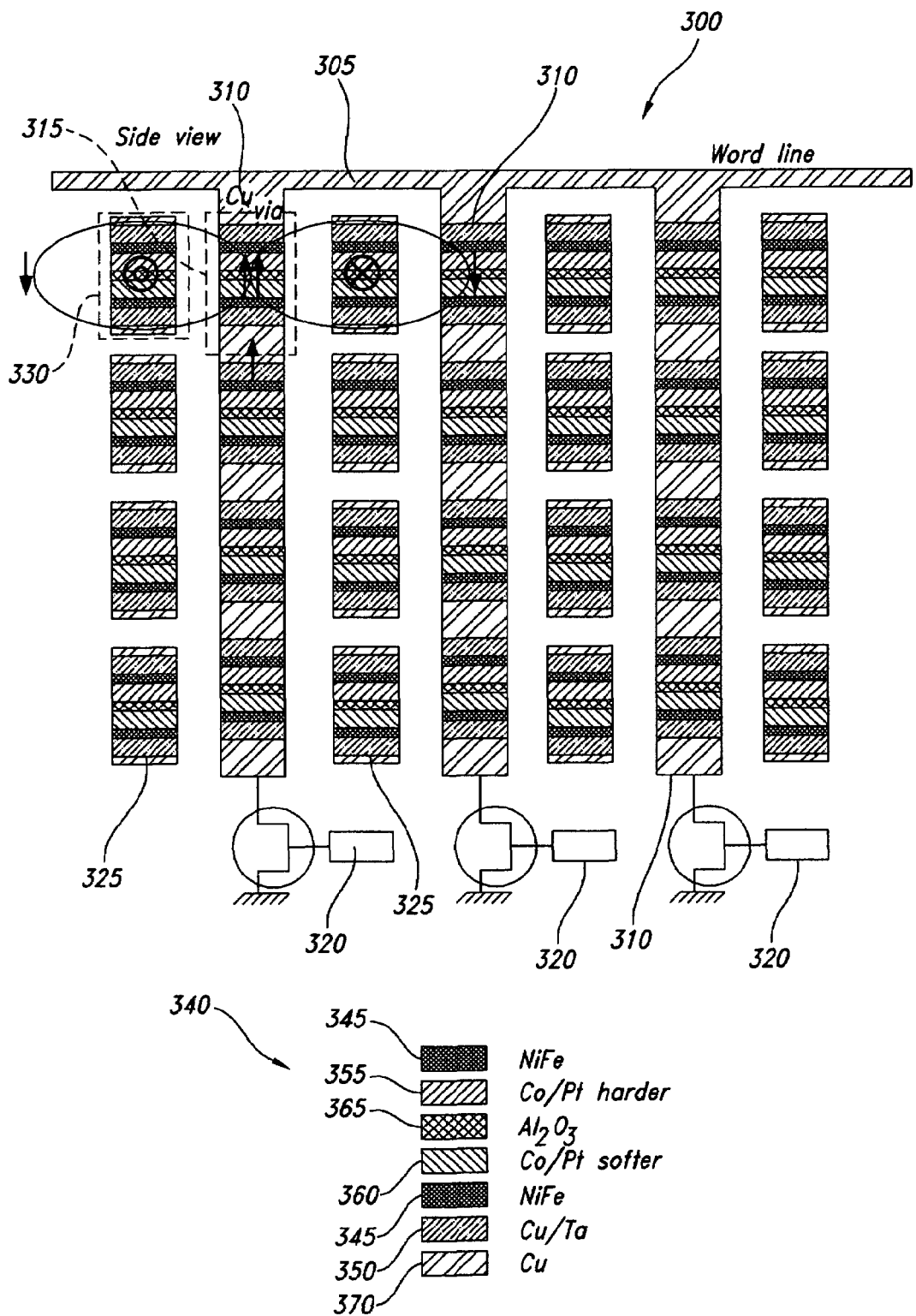
FIG. 3 is a diagram illustrating one embodiment of the invention with out-of-plane magnetization.

FIG. 3 is a cross-sectional diagram illustrating one embodiment of the invention with out-of-plane magnetization. MRAM 300 includes word line 305 connected to memory columns 310 with memory cells 315. Connected opposite word line 305 are switches 320. Bit line columns 325 include bit lines 330.

In one embodiment, memory cells 315 and bit lines 330 in MRAM 300 are composed of several layers. Element 340 illustrates the layers. Layers 345 may include $Ni_{80}Fe_{20}$ that is approximately 30 nm thick. Top and bottom NiFe layers 345 may be included as cladding layers to avoid leakage of magnetic field above and below the bit lines when activated. One purpose of layers 345 is to concentrate the flux on either side of the bit lines 330, rather than above and below.

Layer 350 is a multilayer of (CuTa), shown as 4 repeating layers in 340, which may be included to adjust the conductivity of bit lines 330. The Cu and Ta of each layer may be 10 nm and 5 nm thick respectively.

Layer 355 is a multilayer (4 repeats) of (CoPt), which is the storage layer with higher coercivity (harder) than the readout layer. The Co may be approximately 0.5 nm thick and the Pt may be approximately 2 nm thick.

Layer 360 is a multilayer (2 repeats) of Co/Pt, which is the readout layer with lower coercivity (softer) than the storage layer. The Co may be approximately 0.5 nm thick and the Pt may be approximately 2 nm thick. In CoPt multilayers, the coercive field can be adjusted by varying the thickness of the layers and number of repeats. Generally, the coercive field increases with the number of repeats. One example of values of the coercive field for the readout and storage layers is 20 Oe for the readout layer and 60 Oe for the storage layer. The magnetic polarization of both the readout and storage layers are aligned during a memory write, while the magnetic polarization of only the readout layer is switched during a memory read.

Layer 365 is $Al_2O_3$, which is an insulating layer that forms a tunnel barrier between layers 355 and 360. The $Al_2O_3$ may be approximately 1 nm thick. Layer 365 may be formed, for example, by depositing about 0.8 nm of metallic aluminum and oxidizing it with plasma or natural oxidation.

The other layers in element 340 may be deposited by sputtering. Elements 340 making up memory cells 315 may be connected by copper, aluminum, or other conductors. Elements 340 making up bit lines 330 may be connected by insulators, for example $SiO_2$, $Al_2O_3$, or other oxides. One skilled in the art will recognize that memory cells 315 and bit lines 330 need not be fabricated in the same way or with the same material as each other, however manufacturing is simplified if they are the same.

For out-of-plane magnetization, the magnetic storage and readout layers may be made from Co/Pt multilayers, CoFeNi/Pt multilayers, Co/Pt alloys, Co/Pd multilayers, Co/Pd alloys, CoFeNi/Pd multilayers, Co/Au multilayers, CoFeNi/Au multilayers, Co/Ni multilayers, Ni/Cu multilayers or rare earth-transition metal alloys. If heating is used as a select method (see below), the storage layer can be exchange biased with an antiferromagnetic layer with low blocking temperature, for example $Ir_{20}Mn_{80}$ with a thickness of 6 nm.

Layer 370 between the memory cells may be formed from vapor-deposited or sputtered Cu, which facilitates current transmission through the memory columns. Layer 370 is approximately 100–300 nm thick. The thickness of layer 370 may vary according to selectivity desired between the memory cells. Greater space between memory cells will help selectivity using a single bit line, while less space between memory cells is needed when using two bit lines for selection. Although the various layers have a specific purpose for memory cells, they are not as relevant in the bit lines, where storage does not occur. Rather, bit lines should contain material that will carry current in order to select the memory cells. Layering the bit lines with the same material as the memory cells simplifies manufacturing of the MRAM.

Figure 4:
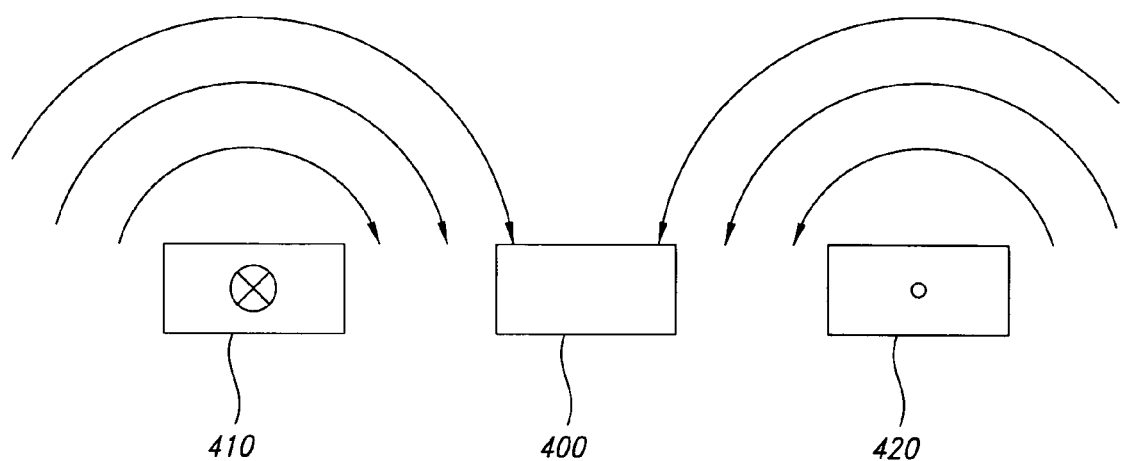
FIG. 4 is a diagram illustrating bit lines, magnetic fields and a memory cell.

FIG. 4 is a diagram illustrating bit lines, magnetic fields and a memory cell. One method for performing a memory write, or storing data within MRAM 300 for out-of-plane magnetization, follows for memory cell 400. A memory write operation for in-plane magnetization differs and will be described below. Electric current flowing in opposite directions is feed to bit lines 410 and 420. Current in bit line 410 flows perpendicular and into the plane of FIG. 4 while current in bit line 420 flows perpendicular and out of the plane of FIG. 4. Because the current is in opposite directions, the magnetic field around each of bit lines 410 and 420 are in opposite directions. The magnetic field around bit line 410 is clockwise while the magnetic field around bit line 420 is counter clockwise.

Memory cell 400 is selected by powering the associated word line and selecting the memory column to which memory cell 400 belongs by turning on the appropriate switch.

Current flowing through a memory cell reduces the switching field by one of several effects. First, thermal heating of the storage layer due to current flowing through the tunnel barrier causes the switching field to decrease. Heating of memory cell 400 makes it possible to align the magnetic polarity in the storage and readout layers with the cumulative effect of magnetic fields around bit lines 410 and 420. Pulses of current through bit lines 410 and 420 can be adjusted so that only the heated junction switches, rather than other memory cells which are at a standby temperature.

Furthermore, the Oersted field due to the vertical current flow through the memory column of memory cell 400 reduces the switching field because it favors the formation of an in-plane vortex state that, due to cylindrical symmetry, helps the reversal of magnetization.

Finally, injection of spin-polarized electrons from the readout layer or from a polarizing additional layer into the storage layer can be used to decrease the switching field of the storage layer magnetization.

Memory cell 400 must be far enough from bit lines 410 and 420 so that current through bit lines 410 and 420 does not leak into memory cell 400, and close enough for a magnetic field around bit lines 410 and 420 to affect the magnetic polarity of memory cell 400. In one embodiment, memory cell 400 is approximately 100 nm from bit line 410. Typically, current through bit lines 410 and 420 (and word lines, see FIG. 1) ranges from 1–5 mA. One skilled in the art will recognize that distances between memory cells and bit lines changes relative to the state of the art and is not a limiting factor of the invention. Decreasing the distance between memory cells increases the density, which is usually a goal in memory design. Also, current levels may differ depending on the particular application.

Figure 5:
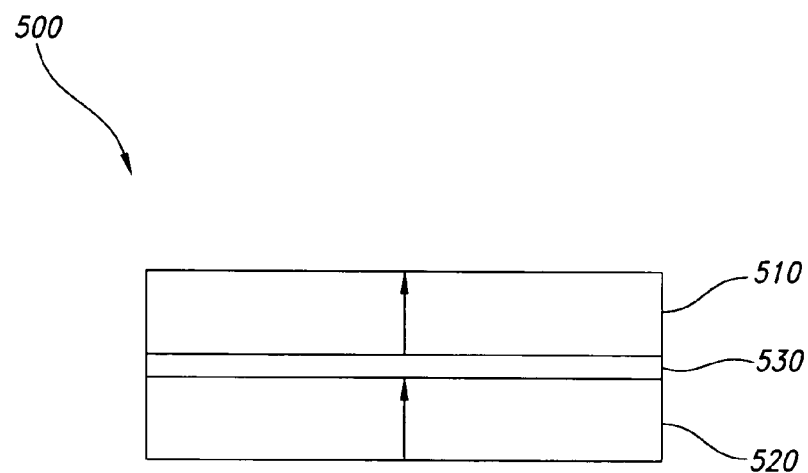
FIG. 5 is a diagram illustrating the storage and readout layers of a memory cell.

FIG. 5 is a diagram illustrating the storage and readout layers of a memory cell with out-of-plane magnetization. After a memory write, memory cell 500 has the magnetic polarization for both readout layer 510 and storage layer 520 aligned in the same direction. Readout layer 510 is separated from storage layer 520 by dielectric layer 530, which creates a tunnel junction between readout layer 510 and storage layer 520. Although FIG. 5 illustrates the readout layer on top, either the readout layer or the storage layer may be on top or bottom. Also, storage values of "1" and "0" may be arbitrarily assigned to storage layer 520 being in the up (parallel) and down (anti-parallel) position.

One method a performing a memory read, or retrieving data from a memory cell, follows for memory cell 106-2, assuming out-of-plane magnetization. One problem with connecting multiple memory cells between a single word line and a transistor is that it is more difficult to detect the resistance of individual memory cells and therefore the polarization of the storage layer within the memory cell. The invention overcomes this difficulty with differential readout.

In a manner similar to memory write, counter-directed current flows through each of bit lines 112-1 and 112-2 (also see FIG. 4). The strength of the magnetic field through memory cell 106-2 (also see 400) is directly related to the strength of current through bit line 112-1 and 112-2 (also see 410 and 420). A magnetic field through memory cell 106-2 (also see 400) is made strong enough to switch readout layer 510 (see FIG. 5), which has lower coercivity than storage layer 520 and is therefore easier to switch its magnetic polarity, but weak enough not to switch storage layer 520. Whether magnetic polarization in readout layer 510 actually switches is irrelevant; rather, it enters a predetermined state based on current flow through bit lines 112-1 and 112-2 (also see 410 and 420).

The resistance of memory column 104-1 is then determined by well know methods. Then, the direction of current through bit lines 112-1 and 112-2 is switched and the respective magnetic fields switch alignment of the magnetic polarization for readout layer 510, again without switching storage layer 520. Resistance of memory column 104-1 is again determined. Based on the difference in resistance between the first reading and the second, and the known magnetic polarization of readout layer 510 during the first and second reading, the magnetic polarization of storage layer 520 becomes known. Resistance through a memory cell is lower when both the storage layer and readout layer are aligned in the same direction, higher when they are aligned in opposite directions.

For example, if readout layer 510 is first aligned in the up direction and then in the down direction, and the resistance during the second reading increases, then storage layer 520 is aligned in the up direction (parallel). Conversely, if readout layer 510 is first aligned in the up direction and then in the down direction, and the resistance during the second reading decreases, then storage layer 520 is aligned in the down direction (anti-parallel). Although a two-part memory read may require more time than a one-part memory read, when used in a NAND mode the stackable arrangement simplifies the read process and improves performance.

There are two commonly used architectures in non-volatile memory cells: NOR and NAND. In the NOR architecture, each bit cell is individually addressed by a separate word line and a separate bit line. In the NAND architecture several memory cells are connected in series to one common word line, for example. The common word line remains in the "on" state while the individual bit lines address each of the connected cells. NOR architectures are often used for programming while NAND memories are typically used for storage applications. The stackable architecture described here lends itself to be used in an NAND configuration.

In another embodiment, the readout layer is biased (with an exchange layer for example) so that the standby direction of its magnetization is always fixed, for example in the upward direction. The readout scheme then involves applying a pulse of opposite currents in the adjacent bit lines to temporarily switch the magnetization of the readout layer in the downward direction (without switching the storage layer) and measure the resulting voltage across the memory stack. If the pulse corresponds to a temporary increase in resistance of the stack, the storage layer is magnetized in the up direction. Conversely, if the pulse corresponds to temporary decrease in the resistance of the stack, the storage layer is magnetized in the down direction. In this embodiment, the read process consists of only one step to determine the state of magnetization of the storage layer.

In another embodiment, selectivity of the memory cell is achieved with current running through a single bit line, rather than both bit lines. One skilled in the art will recognize that the invention encompasses the position of the bit lines with respect to the memory cell and word line. Two bit lines carrying current improves selectivity, but is not necessary to practice the invention. This is applicable to both memory read and memory write.

Figure 6:
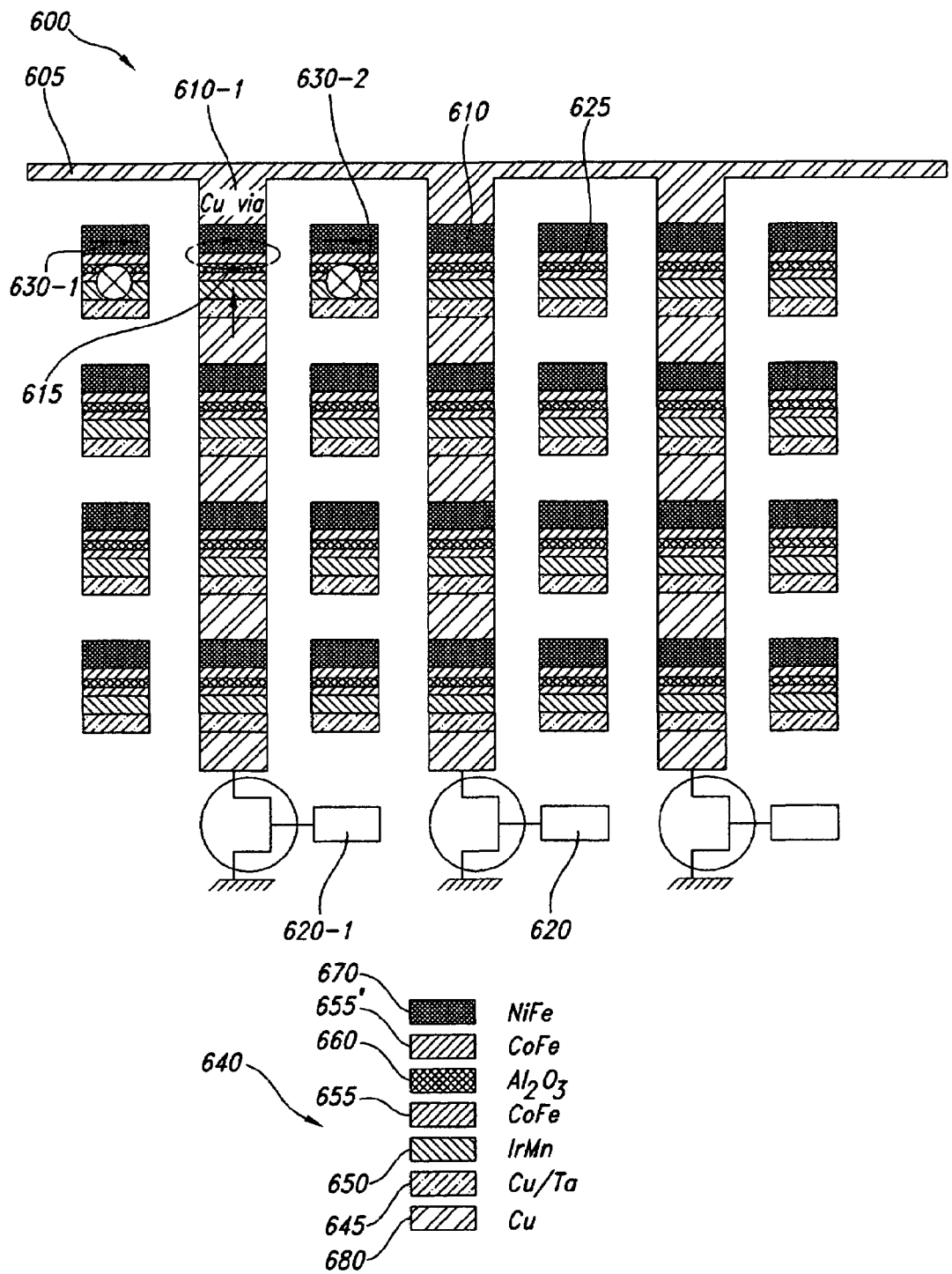
FIG. 6 is a diagram illustrating one embodiment of the invention with in-plane magnetization.

FIG. 6 is a cross-sectional diagram illustrating one embodiment of the invention with in-plane magnetization. MRAM 600 includes word line 605 connected to memory columns 610 with memory cells 615. Connected opposite word line 605 are switches 620. Bit line columns 625 include bit lines 630.

In one embodiment, memory cells 615 and bit lines 630 in MRAM 600 are composed of several layers, described below. Element 640 illustrates the layers. Layer 645 may include a multilayer of (Cu/Ta) (4 repeats) with the Cu approximately 10 nm thick and the Ta approximately 3 nm thick. Layer 645 may be used to adjust the conductivity of the bit lines to the appropriate value, which depends on the length and width of the line. The resistance of layer 645 will not greatly affect the MTJ because the tunnel barrier has a much greater resistance.

Layer 650 is a crystalline lattice of $Ir_{20}Mn_{80}$, with the IrMn approximately 5 nm thick. Layer 655 is $Co_{90}Fe_{10}$, which together with IrMn (layer 650) constitutes the storage layer. Layer 655 is approximately 10–50 nm thick.

Layer 660 is $Al_2O_3$ with a thickness of approximately 1.2 nm. Layer 660 forms the tunnel barrier between the storage and readout layers. Layer 660 may be formed, for example, by depositing about 0.8 nm of metallic aluminum and oxidizing it with plasma or natural oxidation. The other layers in element 640 may be deposited by sputtering.

Layer 670 is $Ni_{80}Fe_{20}$ that is approximately 25 nm thick. Layer 670 forms a free layer that is magnetostatically coupled parallel to the magnetization of the top NiFe layers of the adjacent bit lines. Layer 655' is an optional layer of $Co_{90}Fe_{10}$ if it is desired to have the free layer be a bilayer of $Co_{90}Fe_{10}/Ni_{80}Fe_{20}$ instead of a single layer 670 of just $Ni_{80}Fe_{20}$.

Elements 640 making up bit lines 630 may be connected by insulators, for example $SiO_2$, $Al_2O_3$, or other oxides. One skilled in the art will recognize that memory cells 615 and bit lines 630 need not be fabricated in the same way or with the same material as each other, however manufacturing is simplified if they are the same.

Layer 680 between the memory cells is Cu, which facilitates current transmission through the memory columns. Although the various layers have a specific purpose for memory cells, they are not as relevant in the bit lines, where storage does not occur. Rather, bit lines should contain material that will carry current in order to select the memory cells. Layering the bit lines with the same material as the memory cells simplifies manufacturing of the MRAM.

One method of performing a memory write, or storing data within MRAM 600 for in-plane magnetization, follows for memory cell 615. Electric current flowing (or pulsed) in the same direction is fed to bit lines 630-1 and 630-2. Current in bit lines 630-1 and 630-2 is shown flowing perpendicular and into the plane of FIG. 6. Layer 670 on each of bit lines 630-1 and 630-2 act as cladding layers. Layers 670 are polarized in an Oersted magnetic field generated by the current through bit lines 630-1 and 630-2. Due to the parallel magnetostatic coupling between these layers 670 on bit lines 630-1 and 630-2, and layer 670 on memory cell 615, the magnetization of layer 670 in memory cell 615 aligns parallel to the magnetic field of bit lines 630-1 and 630-2.

In order to select memory cell 615, current flows through word line 605, memory column 610-1, and switch 620-1. Then, because of anti-parallel magnetostatic coupling with the storage layer, the storage layer switches in the anti-parallel direction.

Current flowing through a memory cell reduces the switching field by one of several effects. First, thermal heating of the storage layer due to current flowing through the tunnel barrier causes the switching field to decrease. If the current is large enough the storage layer is heated above its blocking temperature. In $Ir_{20}Mn_{80}$, it is known that the blocking temperature can be adjusted from 150 C to 300 C by varying the thickness of this layer. The Co magnetization becomes anti-parallel to the NiFe layer and freezes in this direction when the temperature decreases back to the standby temperature. Therefore, the direction of magnetic field created by the pulses of current in the bit lines determines the alignment of the magnetization of the storage layer.

Furthermore, the Oersted field due to the vertical current flow through the memory column of the memory cell reduces the switching field because it favors the formation of an in-plane vortex state that, due to cylindrical symmetry, helps the reversal of magnetization. In one embodiment, the storage layer is made with $CO_5Fe_{50}$, or of a CoFe/IrMn bilayer with reduced IrMn thickness, for example 4 nm, so that the storage layer will have greater coercivity but no loop shift.

Finally, injection of spin-polarized electrons from the readout layer or from a polarizing additional layer into the storage layer can be used to decrease the switching field of the storage layer magnetization.

A memory read for in-plane magnetization operates in the same manner as for out-of-plane magnetization, with the exception that current carried through the bit lines travels in the same direction, rather than in opposite directions, during the initial setting of the readout layer and the switching of the readout layer.

In another embodiment, selectivity of the memory cell is achieved with current running through a single bit line, rather than both bit lines. One skilled in the art will recognize that the invention encompasses the position of the bit lines with respect to the memory cell and word line. Two bit lines carrying current improves selectivity, but is not necessary to practice the invention. This is applicable to both memory read and memory write.

Figure 7:
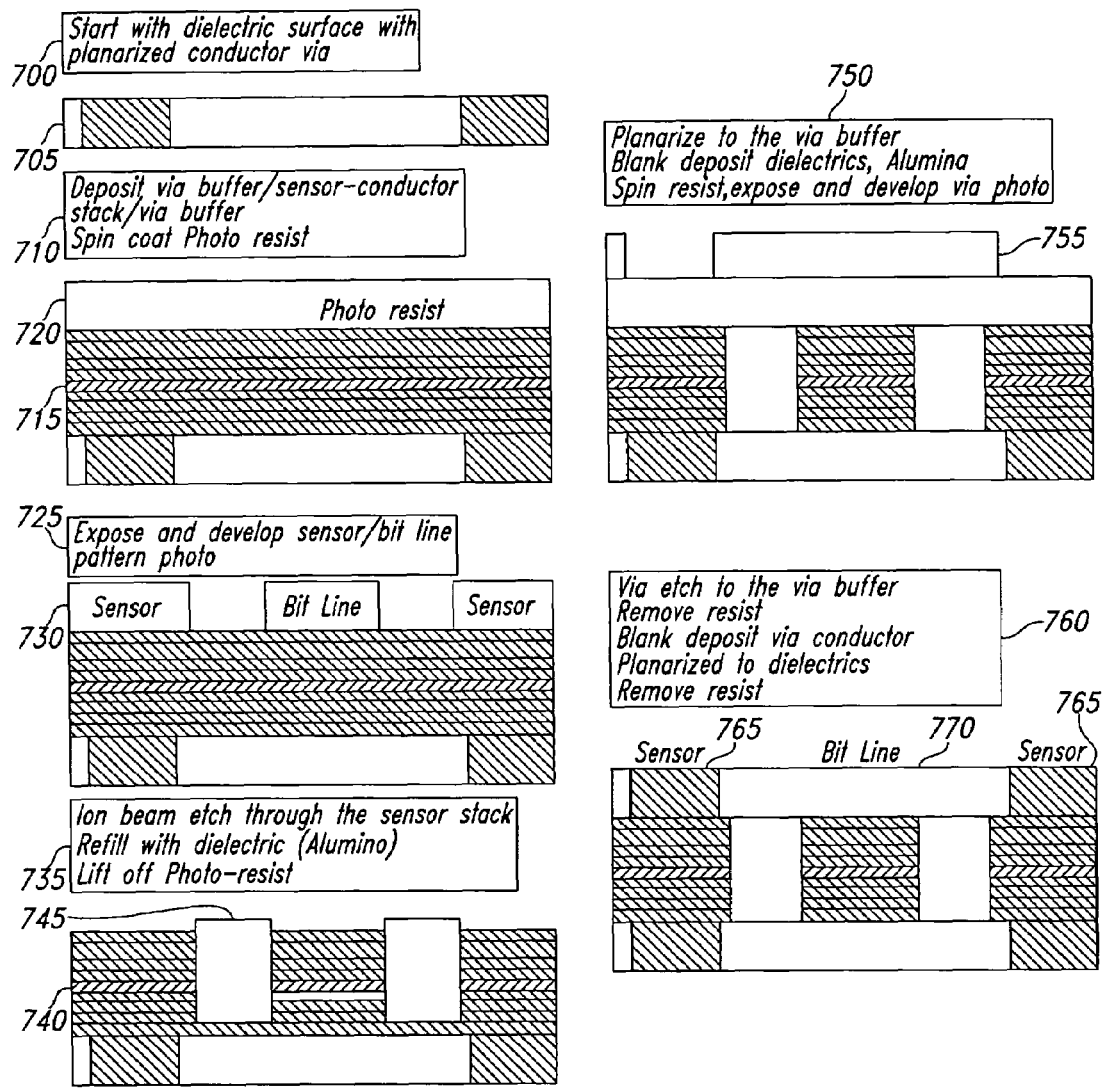
FIG. 7 is a diagram illustrating a sensor bit line making and process flow for the invention.

FIG. 7 is a diagram illustrating the making and process flow for the invention. In block 700, start with planarized dielectric surface 705 with an embedded conductor pad to connect to the memory cell. In block 710, deposit buffer/sensor/conductor stack 715 and spin coat photoresist 720. In block 725, expose and develop memory cell and bit line pattern 730. In block 735, etch with an ion beam through sensor stack 740, fill with dielectric 740, and lift off photoresist. In block 750, planarize buffer 755, blank deposit a dielectric, and spin resist, expose and develop conductor pad for the next conductor stack by photoresist. In block 760, etch to the buffer, remove resist, blank deposit conductor 765, planarize to dielectric 770, and remove resist. This method requires only two photomasking plus one planarization per sensor layer.

Figure 8:
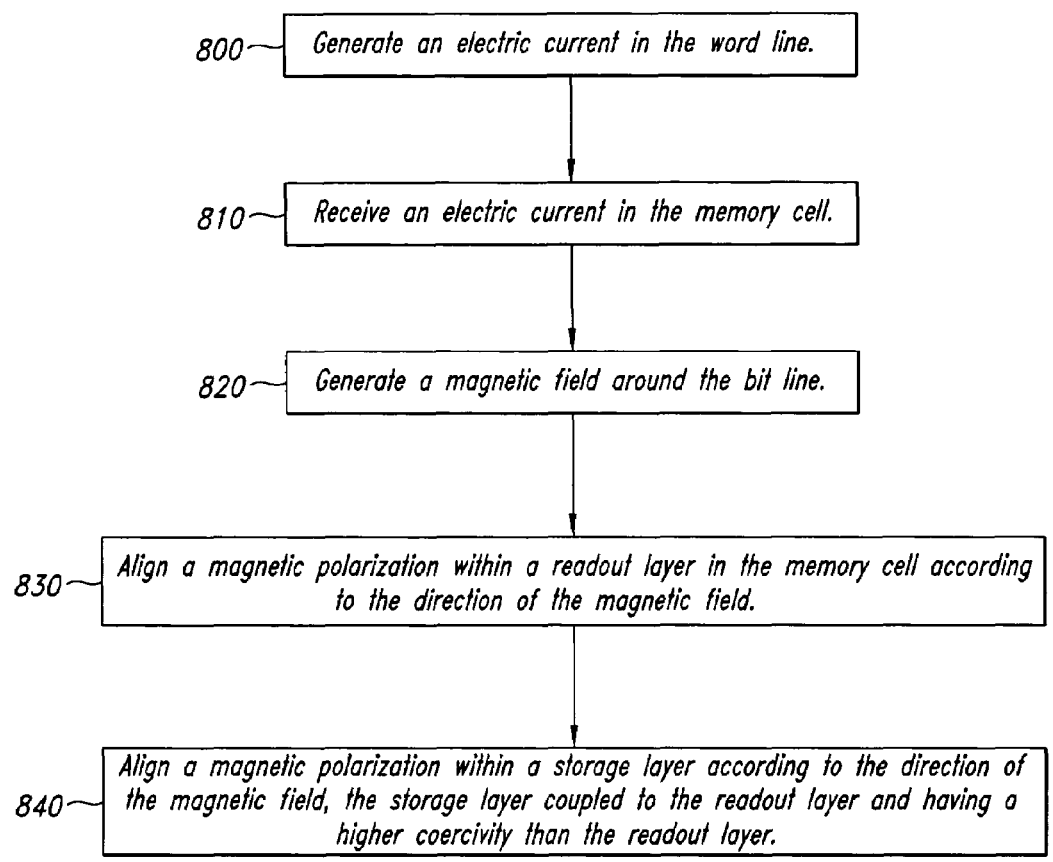
FIG. 8 is a flow diagram illustrating one method of executing memory write.

FIG. 8 is a flow diagram illustrating one method of executing memory write to a MRAM with a word line, a memory cell electrically coupled to the word line, and a bit line coupled to, adjacent to and electrically isolated from the memory cell. In block 800, generate an electric current in the word line. In block 810, receive an electric current in the memory cell. In block 820, generate a magnetic field around the bit line. In block 830, align a magnetic polarization within a readout layer in the memory cell according to the direction of the magnetic field. In block 840, align a magnetic polarization within a storage layer according to the direction of the magnetic field, the storage layer coupled to the readout layer and having a higher coercivity than the readout layer.

Figure 9:
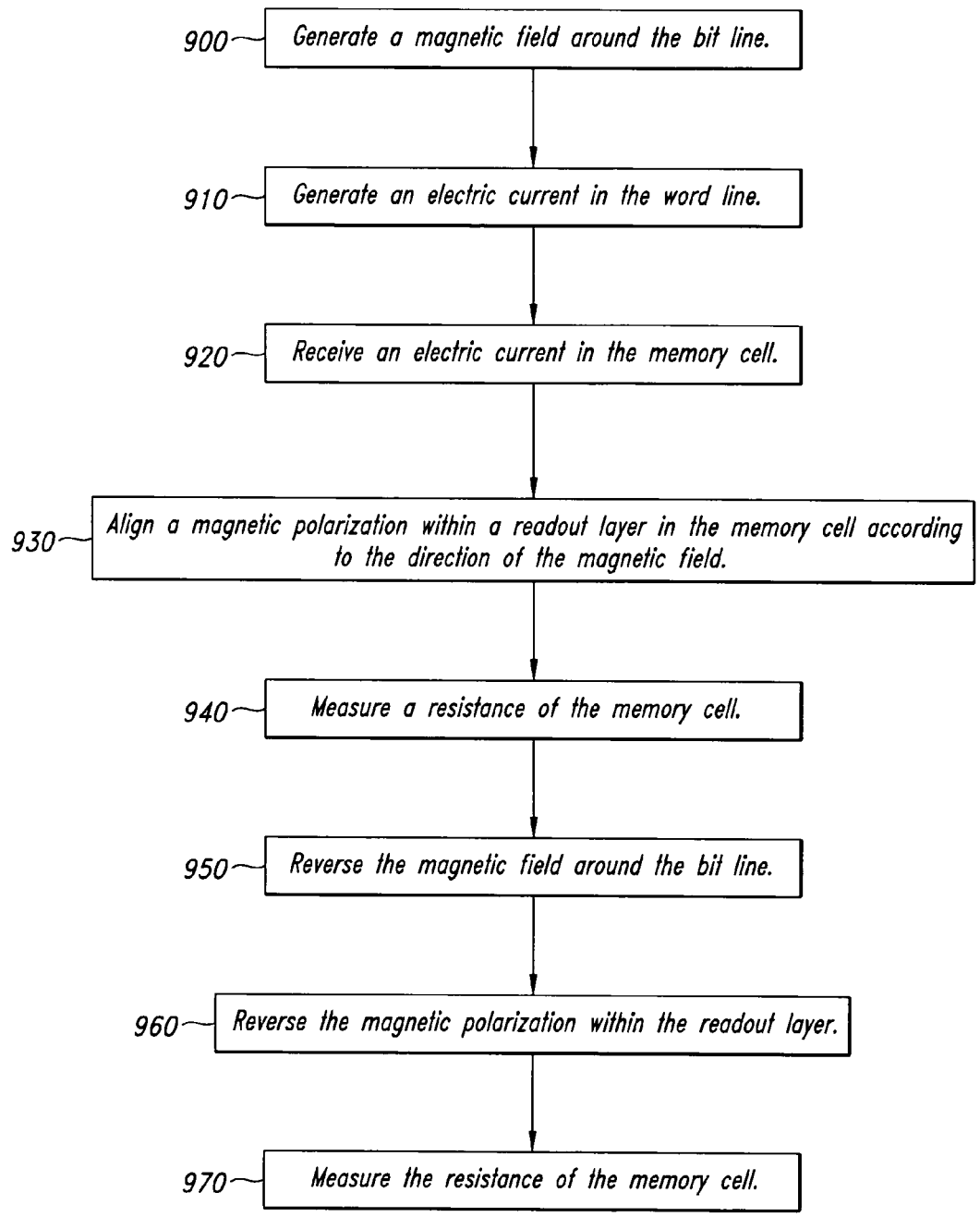
FIG. 9 is a flow diagram illustrating one method of executing memory read.

FIG. 9 is a flow diagram illustrating one method of executing memory read in a MRAM with a word line, a memory cell electrically coupled to the word line, and a bit line coupled to, adjacent to and electrically isolated from the memory cell. In block 900, generate a magnetic field around the bit line. In block 910, generate an electric current in the word line. In block 920, receive an electric current in the memory cell. In block 930, align a magnetic polarization within a readout layer in the memory cell according to the direction of the magnetic field. In block 940, measure a resistance of the memory cell. In block 950, reverse the magnetic field around the bit line. In block 960, reverse the magnetic polarization within the readout layer. In block 970, measure the resistance of the memory cell.

The advantages of the invention include a reduced MRAM cell area achieved by the stackable architecture which reduces the number of word lines, improves the geometry of the bit line/memory cell relationship and uses only one transistor per memory stack rather one transistor per cell. In addition, the readout process is simplified requiring only the determination of the polarity when changing the magnetic states of one cell. In contrast, the prior art compares the resistance of a cell to a distinct reference cell requiring a narrow distribution resistance values. The manufacturing process is simplified by the co-planar metallization process of bit lines and storage cells as well as the repeated application of only 2 masks per layer. Other advantages include improved write selectivity by the use of two adjacent bit lines and increased memory density. For example, the invention may apply an eight-layer design with a cell size of only 1 F2.

One of ordinary skill in the art will recognize that configurations of different materials may be used without straying from the invention. The illustrated embodiments of the invention include, for example transistors, but one skilled in the art recognizes that these may be interchanged and/or replaced by components with similar functionality, for example diodes, applying appropriate circuit rerouting. Additionally, certain combinations of elements have been disclosed in certain thicknesses or certain ratios. However one of ordinary skill in the art will recognize that other ratios will work and other thicknesses may be used, as well as other materials. The embodiments described herein are meant to provide an enabling disclosure only and not meant as limiting features of the invention. As any person skilled in the art will recognize from the previous description and from the figures and claims that modifications and changes can be made to the invention without departing from the scope of the invention defined in the following claims.

What is claimed is:

1. A magnetic random access memory (MRAM) comprising:
    a substrate;
    a first memory cell column extending perpendicularly from the substrate and comprising a plurality of stacked magnetic memory cells electrically coupled to each other, each magnetic memory cell configured to store data;
    a first bit line column extending perpendicularly from the substrate and adjacent to but electrically isolated from the first memory cell column, the first bit line column comprising a plurality of stacked conductive bit lines electrically isolated from each other, each bit line in the first bit line column being associated with a memory cell in the adjacent memory cell column and positioned close enough to its associated memory cell such that an electric current passing through a bit line will produce a magnetic field affecting the memory cell associated with that bit line; and
    a first conductive word line electrically coupled to the first memory cell column and electrically isolated from the first bit line column.

2. The MRAM of claim 1 wherein the bit lines in the first bit line column are aligned parallel to one another and is perpendicular to the first memory cell column.

3. The MRAM of claim 1 further comprising:
    an electrical insulator located between the first bit line column and the first memory cell column.

4. The MRAM of claim 1, further comprising:
    a second bit line column extending perpendicularly from the substrate and electrically isolated from the first conductive word line, the second bit line column comprising a plurality of stacked conductive bit lines electrically isolated from each other, the bit lines in the second bit line column being aligned parallel to one another and to the bit lines in the first bit line column, the first and second bit line columns being located on opposite sides of the first memory cell column; and
    an electrical insulator located between the second bit line column and the first memory cell column.

5. The MRAM of claim 4 further comprising:
    a second memory cell column extending perpendicularly from the substrate and electrically coupled to the first conductive word line and comprising a plurality of stacked magnetic memory cells electrically coupled to each other, each memory cell configured to store data, the second memory cell column being parallel to the first memory cell column and adjacent to the first bit line column.

6. The MRAM of claim 5 further comprising:
    a second conductive word line parallel to the first conductive word line; and
    a third memory cell column extending perpendicularly from the substrate parallel to the first memory cell column and electrically coupled to the second conductive word line and comprising a plurality of magnetic memory cells electrically coupled to each other, each memory cell configured to store data.

7. The MRAM of claim 6 wherein the third memory cell column is located between the first and second bit line columns.

8. The MRAM of claim 6 wherein one of the plurality of memory cells in the first memory cell column is configured to store data when electric current flows through the first conductive word line into the first memory cell column and electric current flows through one of the bit lines in the second bit line column.

9. The MRAM of claim 8 wherein one of the plurality of memory cells in the first memory cell column is further configured to store data when electric current flows through one of the bit lines in the first bit line column.

10. The MRAM of claim 9 wherein the direction of current flowing through one of the bit lines in the first bit line column is opposite the direction of current flowing through one of the bit lines in the second bit line column.

11. The MRAM of claim 9 wherein the direction of current flowing through one of the bit lines in the first bit line column is the same as the direction of current flowing through one of the bit lines in the second bit line column.

12. The MRAM of claim 1, each of the memory cells in the first memory cell column further comprising:
    a readout layer configured to have a magnetic polarization; and
    a storage layer coupled to the readout layer and configured to have a magnetic polarization, the storage layer having a higher coercivity than the readout layer.

13. The MRAM of claim 12, wherein the readout layer and the storage layer are configured to align their magnetic polarizations with a magnetic field generated by the electric current in one of the bit lines during memory write, and the readout layer is configured to align its magnetic polarization with a magnetic field generated by the electric current in one of the bit lines during memory read.

14. A magnetic random access memory (MRAM) comprising:
    a substrate;
    a word line configured to carry electric current;
    a stack of magnetic memory cells extending perpendicularly from the substrate and electrically coupled to the word line, each memory cell configured to store data; and a stack of bit lines extending perpendicularly from the substrate adjacent to the stack of memory cells, each bit line being magnetically coupled to an adjacent associated magnetic memory cell and electrically isolated from the word line, each bit line configured to set a magnetic polarization within its adjacent associated magnetic memory cell during a memory write operation and to set a magnetic polarization within its adjacent associated magnetic memory cell during a memory read operation.

15. The MRAM of claim 14 wherein each bit line is further configured to reverse a magnetic polarization within its adjacent associated magnetic memory cell during the memory read operation.

16. A method of writing to magnetic random access memory (MRAM) with a word line, a magnetic memory cell electrically coupled to the word line, a switch electrically coupled to the memory cell, and a bit line magnetically coupled to, adjacent to and electrically isolated from the memory cell, the method comprising:
  generating an electric current in the word line;
  turning on the switch to direct current from the word line through the memory cell;
  generating a magnetic field around the bit line while current from the word line is passing through the memory cell to thereby align a magnetic polarization within the magnetic memory cell according to the direction of the magnetic field.

17. The method of claim 16 wherein generating a magnetic field around the bit line to thereby align a magnetic polarization within the magnetic memory cell comprises:
  aligning a magnetic polarization within a readout layer in the magnetic memory cell according to the direction of the magnetic field; and
  aligning a magnetic polarization within a storage layer in the magnetic memory cell according to the direction of the magnetic field, the storage layer coupled to the readout layer and having a higher coercivity than the readout layer.

18. The method of claim 17, further comprising:
  generating an electric current; and
  electrically lowering the switching field of the memory cell.

19. The method of claim 17, further comprising:
  heating the memory cell; and
  lowering the switching field of the memory cell.

20. The method of claim 17, further comprising:
  generating an electric current; and
  magnetically lowering the switching field of the memory cell.

21. A method of reading from a magnetic random access memory (MRAM) with a word line, a magnetic memory cell electrically coupled to the word line, and a bit line magnetically coupled to, adjacent to and electrically isolated from the magnetic memory cell, the method comprising:
  generating a magnetic field in a first direction around the bit line to thereby align a magnetic polarization within the memory cell according to said first direction of the magnetic field;
  measuring a resistance of the memory cell;
  generating a magnetic field in a second direction opposite said first direction around the bit line to thereby reverse the magnetic polarization within the magnetic memory cell; and
  measuring the resistance of the magnetic memory cell with said reversed magnetic polarization.

22. The method of claim 21 wherein measuring the resistance of the magnetic memory cell comprises:
  generating an electric current in the word line; and
  receiving an electric current in the magnetic memory cell.

23. The method of claim 21 wherein generating a magnetic field in a first direction around the bit line to thereby align a magnetic polarization within the memory cell comprises aligning a magnetic polarization within a readout layer in the magnetic memory cell; and wherein generating a magnetic field in a second direction opposite said first direction around the bit line to thereby reverse the magnetic polarization within the magnetic memory cell comprises reversing the magnetic polarization within the readout layer.

24. A method of reading from a magnetic random access memory (MRAM) with a word line, a magnetic memory cell electrically coupled to the word line, and a bit line magnetically coupled to, adjacent to and electrically isolated from the memory cell, the method comprising:
  measuring the resistance of the magnetic memory cell;
  generating a magnetic field around the bit line to thereby reverse a magnetically pre-existing polarization within the magnetic memory cell according to the direction of the magnetic field; and
  measuring the resistance of the memory cell.

25. A magnetic random access memory (MRAM) with stackable architecture comprising:
  a memory cell comprising:
  a storage layer with high-coercivity configured for storing information;
  a thin insulating layer coupled to the storage layer and configured to form a magnetic tunneling junction (MTJ); and
  a readout layer with low-coercivity coupled to the thin insulating layer and configured to provide a relative readout for determining the magnetization of the storage layer.

26. The MRAM of claim 25 wherein the storage and readout layers further comprise a plurality of CoPt layers, wherein the number of CoPt layers determines the relative coercivity between the storage and readout layers.

27. The MRAM of claim 26 further comprising:
  a first bit line magnetically coupled to and electrically isolated from the magnetic memory cell; and
  a second bit line magnetically coupled to and electrically isolated from the magnetic memory cell and parallel to the first bit line, wherein the first and second bit lines are configured to generate a magnetic field at the location of the magnetic memory cell by conveying electric current in opposite directions.

28. The MRAM of claim 26 further comprising:
  a first bit line magnetically coupled to and electrically isolated from the magnetic memory cell; and
  a second bit line magnetically coupled to and electrically isolated from the magnetic memory cell and parallel to the first bit line, wherein the first and second bit lines are configured to generate a magnetic field at the location of the magnetic memory cell by conveying electric current in the same direction.

29. The MRAM of claim 28 wherein the magnetic memory cell is between the first and second bit lines.

30. The MRAM of claim 28 further comprising:
  a cladding layer coupled to the storage layer and configured to magnetically couple the first and second bit lines to the magnetic memory cell, wherein the magnetization of the storage layer switches through antiparallel magnetic coupling of the storage layer and the cladding layer.

31. The MRAM of claim 30 further comprising:
a first CuTa layer coupled to the memory cell;
a second CuTa layer coupled to the first bit line; and
a third CuTa layer coupled to the second bit line, the first, second and third CuTa layers configured to control the resistance of the magnetic memory cell, first and second bit lines.

32. A magnetic random access memory (MRAM) with stacked memory layers comprising:
a substrate;
a first memory layer on the substrate and comprising (a) first plurality of magnetic memory cells aligned in a first row, each of the first plurality of memory cells separated by an insulator and electrically isolated from each other and configured to store information; (b) a first conductive bit line parallel to, horizontally disposed from, and electrically isolated from the first row, the first bit line configured to select from the first plurality of magnetic memory cells, wherein the first bit line is close enough to be magnetically coupled to the first row; and (c) a second conductive bit line parallel to and electrically isolated from the first row, the first row being located between the first and second bit lines, the second bit line configured in conjunction with the first bit line, to select from the first plurality of magnetic memory cells, wherein the second bit line is close enough to be magnetically coupled to the first row;
a second memory layer on the first memory layer and comprising (d) a second plurality of magnetic memory cells aligned in a second row above the first row, each of the second plurality of memory cells separated by an insulator and electrically isolated from each other and configured to store information, each of the memory cells in the second row being stacked on and aligned with a corresponding memory cell in the underlying first row to form a memory cell column on the substrate; (e) a third conductive bit line above the first conductive bit line and parallel to, horizontally disposed from, and electrically isolated from the second row, the third bit line being stacked on and aligned with the underlying first bit line to form a first bit line column on the substrate, the third bit line configured to select from the second plurality of magnetic memory cells, wherein the third bit line is close enough to be magnetically coupled to the second row; and (f) a fourth conductive bit line above the second conductive bit line and parallel to and electrically isolated from the second row, the second row being located between the third and fourth bit lines, the fourth conductive bit line being stacked on and aligned with the underlying second bit line to form a second bit line column on the substrate, the fourth bit line configured, in conjunction with the third bit line, to select from the second plurality of magnetic memory cells, wherein the fourth bit line is close enough to be magnetically coupled to the second row; and
a plurality of conductive word lines above the second layer and aligned orthogonal to and electrically isolated from the bit lines, each conductive word line being electrically coupled to a respective memory cell column.

33. A method of manufacturing a magnetic random access memory (MRAM), comprising:
sequentially depositing a series of layers on a dielectric surface; and
thereafter patterning the deposited layers to simultaneously form a plurality of parallel rows of memory cells and a plurality of conductive bit lines parallel to the memory cell rows.

* * * * *